United States Patent [19]
Matsumoto et al.

[11] Patent Number: 5,128,280
[45] Date of Patent: Jul. 7, 1992

[54] FABRICATION PROCESS FOR WAFER ALIGNMENT MARKS BY USING PERIPHERAL ETCHING TO FORM GROOVES

[75] Inventors: Ryoichi Matsumoto; Toshikazu Kuroda; Takao Kato, all of Tokyo, Japan

[73] Assignee: Oki Electric Industry Co., Ltd., Tokyo, Japan

[21] Appl. No.: 732,602

[22] Filed: Jul. 19, 1991

Related U.S. Application Data

[62] Division of Ser. No. 523,489, May 15, 1990.

[30] Foreign Application Priority Data

May 16, 1989 [JP] Japan .................................. 1-120532
May 19, 1989 [JP] Japan .................................. 1-124393

[51] Int. Cl.$^5$ ............................................. H01L 21/441
[52] U.S. Cl. ...................................... 437/203; 437/924; 437/947; 148/33.4; 148/DIG. 50
[58] Field of Search ............... 437/192, 195, 200, 203, 437/924, 947, 981, 67, 69; 148/33.4, DIG. 26, DIG. 50, DIG. 102, DIG. 161

[56] References Cited

U.S. PATENT DOCUMENTS

| | | | |
|---|---|---|---|
| 4,534,804 | 8/1985 | Cade | 437/924 |
| 4,636,281 | 1/1987 | Buiguez et al. | 148/DIG. 50 |
| 4,824,795 | 4/1989 | Blanchard | 437/981 |
| 4,936,930 | 6/1990 | Gruber et al. | 437/924 |

Primary Examiner—Brian E. Hearn
Assistant Examiner—C. Chaudhari
Attorney, Agent, or Firm—Edward D. Manzo

[57] ABSTRACT

A wafer fabrication process uses peripheral etching to form grooves in a wafer substrate around the periphery of windows opened for dopant diffusion and alignment mark formation, and forms $Si_3N_4$ tapers in the grooves. Although ultimately removed, the grooves create a pattern with nearly vertical sidewalls in the substrate which, when transferred to an epitaxial layer, forms wafer alignment marks with sharp edges. The process can be used to form wafer alignment marks having arbitrary patterns and can be adopted to improve the reliability of automatic alignment without the need to make new masks.

4 Claims, 9 Drawing Sheets

FABRICATION PROCESS FOR WAFER ALIGNMENT MARKS BY USING PERIPHERAL ETCHING TO FORM GROOVES

This is a division of application Ser. No. 07/523,489, filed May 15, 1990.

BACKGROUND OF THE INVENTION

This invention relates to an improved wafer alignment mark for alignment of a wafer and mask in a semiconductor fabrication process, and to an improved wafer fabrication process for forming wafer alignment marks.

In order to describe the invention and the problem it addresses, it will be useful to begin with a fairly detailed description of the relevant prior art.

Figure 1:
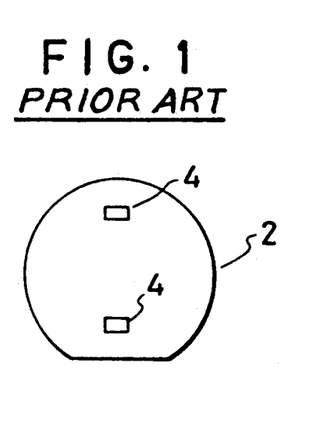
FIG. 1 is a plan view of a wafer, showing the location of alignment marks.

With reference to FIG. 1, a semiconductor wafer 2 comprises a crystalline silicon substrate on which circuit and device patterns are formed by a sequence of photolithographic processes, each of which requires the wafer 2 to be exposed to light through a mask. In each photolithographic process, wafer alignment marks 4 are formed to enable precise alignment between the wafer 2 and the mask in the next photolithographic process. It is desirable that the wafer and mask be alignable by an automatic alignment system without human intervention.

Figure 2:
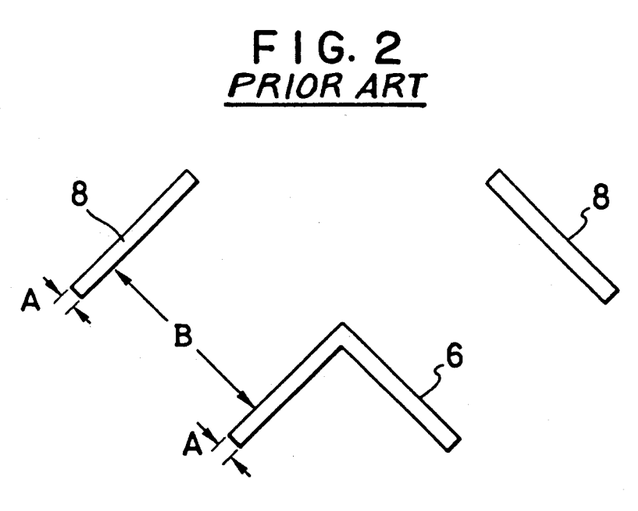
FIG. 2 is a plan view of a prior-art wafer alignment mark.

An alignment mark has the configuration shown in FIG. 2, comprising a chevron 6 and two stripes 8, the stripes 8 being parallel to the two branches of the chevron 6. The width A of the chevron 6 and stripes 8 is generally from 5 to 20 micrometers, and the stripes 8 are separated from the chevron 6 by a distance B of 50 to 150 micrometers.

Figure 3:
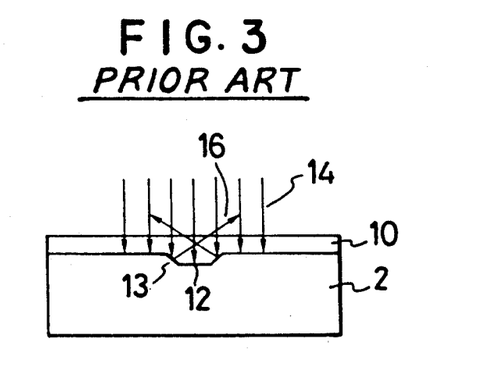
FIG. 3 is a sectional view illustrating the scattering of light from the edges of an alignment mark.

FIG. 3 shows a sectional view through the short dimension of an alignment-mark pattern at a point in the process when the wafer 2 is covered by a transparent photoresist 10. The wafer alignment mark pattern is formed as a depression 12 in the wafer 2. Light 14 incident on the wafer 2 is scattered at the edges 13 of the depression 12. Using standard dark-field microscopy techniques, the wafer 2 can be illuminated from an angle such that the scattered light 16 is focused onto a photodiode array (not shown in the drawing) while light reflected from flat parts of the wafer 2 is not focused onto the array.

Figure 4A:
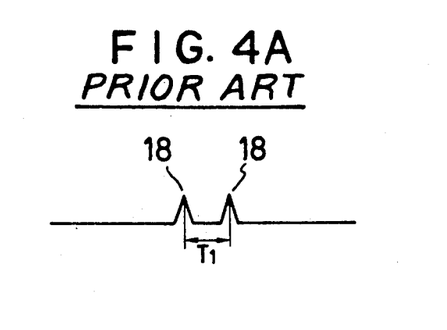
FIGS. 4A and 4B illustrate signals from a photodiode array illuminated by light scattered from a wafer.

FIG. 4A shows the signal output by the photodiode array when illuminated by scattered light from the wafer 2 in FIG. 3. The edges 13 of the depression 12 in FIG. 3 are detected as a pair of peaks 18 in the output signal, the separation $T_1$ between the peaks corresponding to the pattern width A in FIG. 2.

Figure 4B:
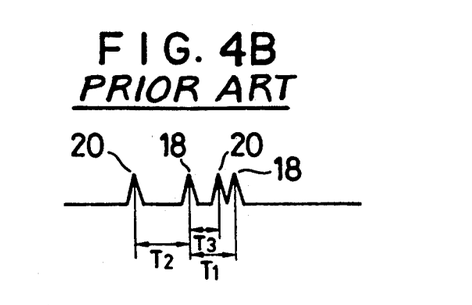

Light is scattered not only by the edges 13 of the depression 12 in FIG. 3 but also by dirt or projections on the surface of the wafer 2, so the output from the photodiode array may be confused by noise. For example, instead of the signal in FIG. 4A, the signal in FIG. 4B may be obtained, containing both peaks 18 representing the edges of the wafer alignment mark and extraneous peaks 20. To eliminate the extraneous peaks 20, the signal is processed by pattern-recognition equipment (not shown in the drawings) that recognizes only pairs of peaks with a separation of $T_1$. In FIG. 4B $T_2 > T_1 > T_3$, so the pattern-recognition equipment rejects the extraneous peaks 20 and recognizes only the peaks 18, giving the same result as in FIG. 4A.

Figure 5:
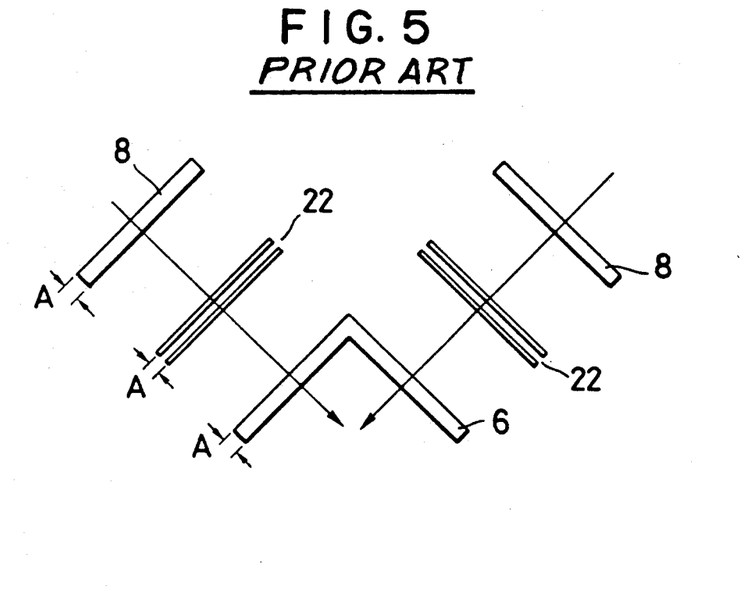
FIG. 5 illustrates a mask alignment mark correctly aligned with a wafer alignment mark.

The mask which is to be aligned to the wafer is provided with mask alignment marks in positions corresponding to the wafer alignment marks. With reference to FIG. 5, a mask alignment mark comprises two pairs of parallel slits 22, each slit about two or three micrometers in width. The two slits in each pair are separated by a distance equal to the width A of the mask alignment mark, so that they can be recognized by the pattern-recognition equipment. The mask and wafer are correctly aligned when the pairs of parallel slits 22 of the mask alignment mark are disposed midway between the chevron 6 and strips 8 of the wafer alignment mark, as shown in FIG. 5.

Figures 6A, 6B:
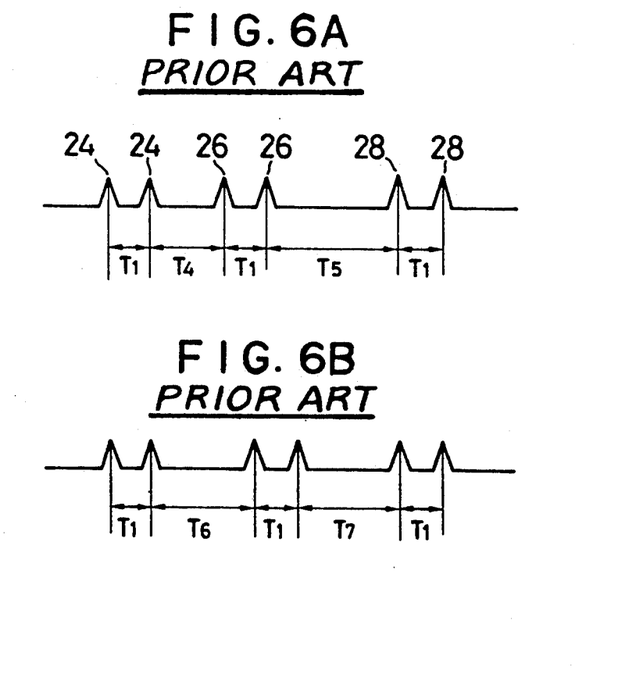
FIGS. 6A and 6B illustrate the alignment process.
Figure 7A:
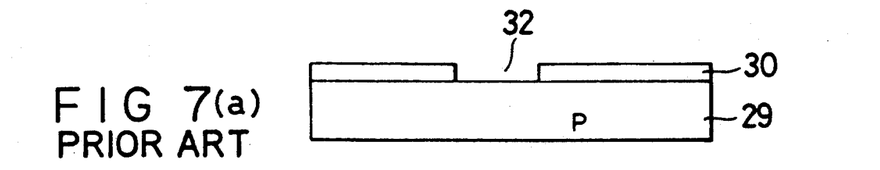
FIG. 7 illustrates steps in the formation of a prior-art wafer alignment mark.
Figure 7B:
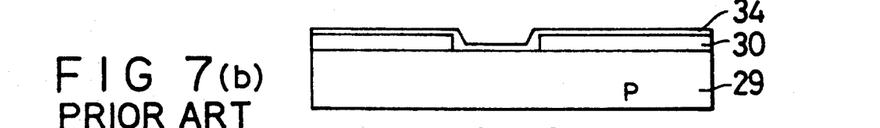
Figure 7C:
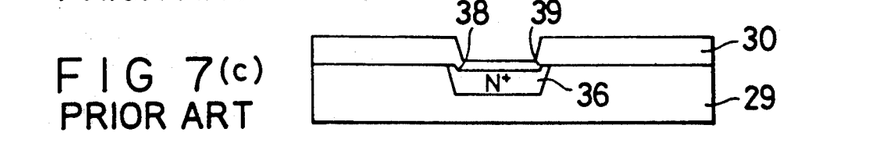
Figure 7D:
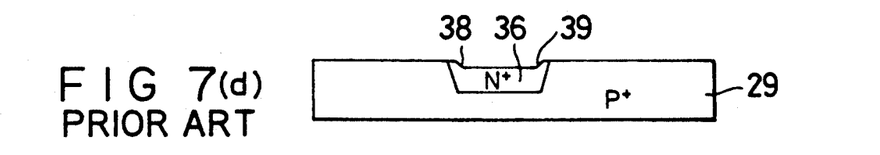
Figure 7E:
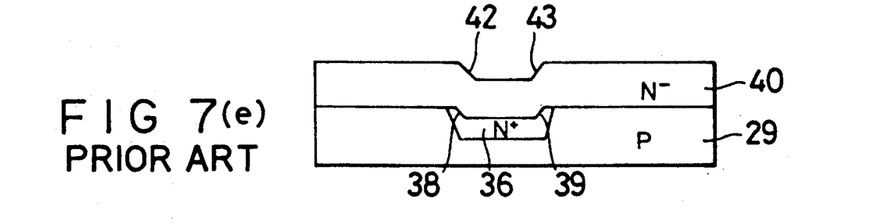
Figure 7F:
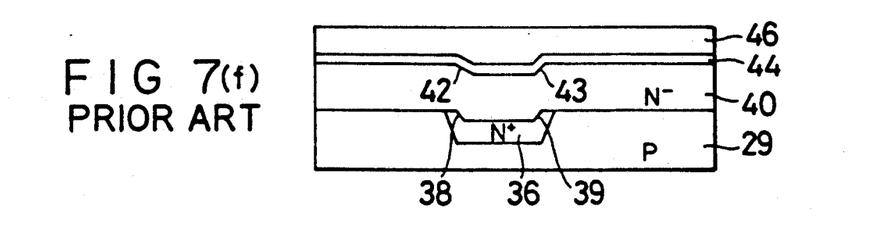

Alignment is performed by placing the wafer and mask in approximately the correct relative position, illuminating them, and detecting scattered light as described above. In FIG. 6A three pairs of peaks are detected, a first pair 24 representing the chevron in the wafer alignment mark, a second pair 26 representing a pair of slits in the mask alignment mark, and a third pair 28 representing a stripe in the wafer alignment mark. The distance $T_4$ between the first and second pairs is unequal to the distance $T_5$ between the second and third pairs, indicating that the wafer and mask are incorrectly aligned. The mask or wafer is accordingly moved under automatic control until, as shown in FIG. 6B, the distances $T_6$ and $T_7$ between the middle pair of peaks and the other two pairs of peaks are equal. The required motion can be calculated automatically from the distances $T_4$ and $T_5$ in FIG. 6A.

With reference again to FIG. 5, the alignment process is performed by scanning the alignment marks in both of the directions indicated by the arrows, thus defining a unique point of correct alignment. The alignment process is performed at two or more alignment marks disposed on different parts of the wafer, as shown in FIG. 1, thereby defining two or more correctly aligned points, ensuring that the entire wafer and mask are aligned in a unique correct relative position.

Alignment marks are formed, for example, during the part of the bipolar semiconductor fabrication process that creates n-type diffusion areas in a p-type silicon substrate. An alignment mark is created as an extra n-type diffusion area with the chevron-and-stripes shape shown in FIG. 2. The prior-art process is illustrated in FIG. 7.

In step (a) in FIG. 7, a p-type silicon substrate 29 is heated to 1040° C. for three hours in a wet oxygen atmosphere to grow an oxide layer 30, which is then patterned by photolithography and etched to open windows 32 for creating the diffusion areas and alignment marks. The substrate 29 basically has a <100> or <111> crystal orientation, but it is standard practice to tilt the orientation a few degrees from the exact <100> or <111> direction in order to reduce the occurrence of surface defects on the substrate 29, below the oxide layer 30, as described in Japanese Patent Application Publication No. 182/1975, and to reduce slumping and dislocations after epitaxial growth, as described on page 87 of the book *Shirikon Kesshou to Dopingu* (Silicon Crystals and Doping) published by Maruzen in Japan.

In step (b) in FIG. 7, an antimony-silica film 34 with a thickness of 2000 to 3000 angstroms is spin-coated onto the wafer as an n-type dopant source.

In step (c) in FIG. 7, the wafer is heated to 1250° C. for four hours in an inert ($N_2$) atmosphere, causing the formation of an n-type buried layer 36 with a diffusion depth of five micrometers and sheet resistance of 20 ohms per square. During this step a small amount of oxygen is added to the inert atmosphere, or the wafer is oxidized in an oxygen atmosphere afterward. Since the rate of oxidation is faster over the buried layer 36 than on the part of the substrate 29 covered by the oxide layer 30, a depressed pattern is created in the substrate 29 with edges 38 and 39. The mechanism by which these edges 38 and 39 are formed is well understood; a detailed discussion will be omitted. The oxidation process is anisotropic, so the edges 38 and 39 have straight, symmetrical slopes of substantially 3° to 10°, the exact angle depending on the temperature and oxygen conditions.

In step (d) in FIG. 7, a hydrofluoric acid etchant is used to remove the oxide layer 30 in preparation for epitaxial growth. The edges 38 and 39 remain intact.

In step (e) in FIG. 7, epitaxial growth is carried out to form an n-type epitaxial layer 40. The slopes of the edges 38 and 39 are transferred to the epitaxial layer 40, creating a depressed pattern with edges 42 and 43 on the surface of the epitaxial layer 40. Although the edges 38 and 39 are symmetrical, due to the deviation of the substrate 29 from the exact $<100>$ or $<111>$ crystal orientation, the edges 38 and 39 have different crystallographic structures which, for reasons not yet completely understood, cause the edges 42 and 43 on the epitaxial layer to slump to different degrees. In FIG. 7 the edge 43 does not slump and has substantially the same slope as the edge 39, but the edge 42 slumps considerably and acquires a much more gentle slope.

In step (f) in FIG. 7, an oxide layer 44 is grown as an isolation diffusion mask, then a transparent photoresist 46 is spin-coated in preparation for further photolithography. In the succeeding photolithographic process a new mask must be aligned with wafer alignment marks defined by edges such as the edges 42 and 43.

Next a common problem occurring in mask alignment after epitaxial growth will be described with reference to FIGS. 8 to 10.

Figure 8:
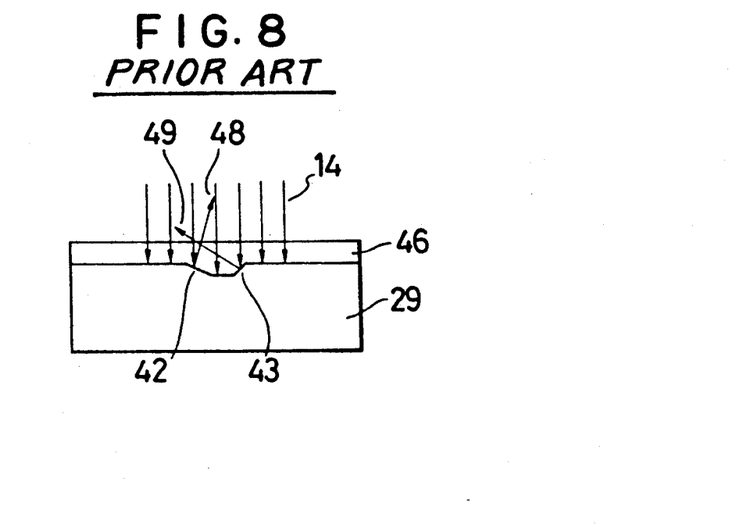
FIG. 8 illustrates slumping of an edge of a prior-art wafer alignment mark.

With reference to FIG. 8, in the alignment process the wafer is illuminated through the photoresist 46 to detect light scattered from the edges 42 and 43 using a photodiode array, as already explained. Due to the difference in slopes, however, light 48 scattered from the edge 42 returns at a higher angle than light 49 scattered from the edge 43.

Figure 9:
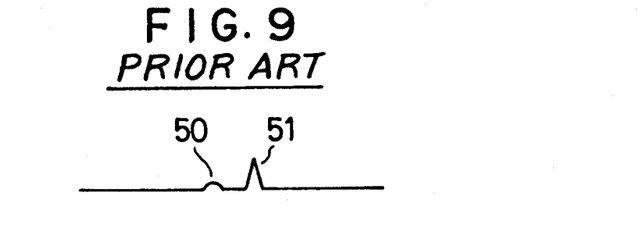
FIG. 9 illustrates the signal detected from the wafer alignment mark in FIG. 8.

With reference to FIG. 9, because of the different scattering angles, the edge 42 produces only a low peak 50 in the output of the photodiode array, while the edge 42 produces a normal high peak 51.

Figure 10:
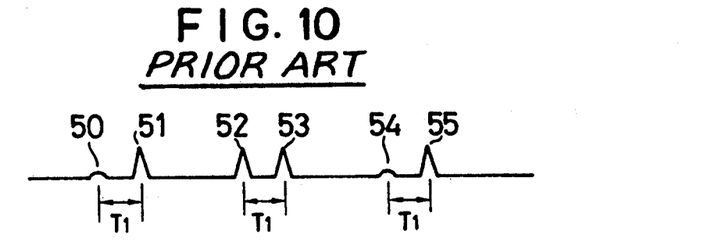
FIG. 10 illustrates failure of the alignment process.

With reference to FIG. 10, when it attempts to align the mask and wafer, the automatic alignment system sees a low peak 50 and high peak 51 representing one part of the wafer alignment mark, two high peaks 52 and 53 representing the mask alignment mark, and a low peak 54 and high peak 55 representing another part of the wafer alignment mark. The low peaks 50 and 54, however, are below the threshold of detection and are ignored, and since the high peaks 51 and 55 fail to be paired with peaks at the necessary separation $T_1$, they too are ignored. Automatic alignment therefore fails and the wafer and the mask must be aligned by a human operator.

If the detection threshold is lowered in order to detect low peaks such as the peaks 50 and 54, a large amount of noise will also be detected. The automatic alignment system is then unable to discriminate between alignment-mark peaks and noise and may mis-align the mask and wafer, causing an entire defective wafer to be produced.

SUMMARY OF THE INVENTION

An object of the present invention is accordingly to provide a reliably detectable wafer alignment mark.

Another object is create wafer alignment marks with sharp edges.

A wafer alignment mark according to a first aspect of the invention comprises a plurality of patterns formed in the surface of the wafer, each pattern comprising a pair of parallel grooves separated by a certain distance, this distance being the same in all patterns of the wafer alignment mark.

A wafer fabrication process according to a second aspect of the invention comprises steps of:

sequentially forming, on a first-conductive-type semiconductor substrate of a wafer, an oxide layer, an $MoSi_2$ layer, and a photoresist layer;

opening windows in the photoresist layer for dopant diffusion and alignment mark formation, and removing the $MoSi_2$ layer from the periphery of the windows by peripheral etching;

etching the oxide layer and substrate to form grooves in the areas from which the $MoSi_2$ has been removed;

removing the photoresist and $MoSi_2$, forming an $Si_3N_4$ layer, then removing the $Si_3N_4$ layer by anisotropic etching, leaving tapers of $Si_3N_4$ in the grooves;

diffusing a dopant through the windows and forming a drive-in oxide layer in areas not occupied by the tapers;

removing the oxide layer, drive-in oxide layer, and tapers, and forming a second-conductive-type epitaxial semiconductor layer on the substrate; and aligning the wafer with a mask according to light scattered from the epitaxial semiconductor layer.

DETAILED DESCRIPTION OF THE EMBODIMENTS

A novel wafer alignment mark that overcomes the preceding problem of the prior art will be described with reference to FIGS. 11 to 13. Then a novel method of fabricating an alignment mark, that also overcomes the preceding problem of the prior art, will be described with reference to FIG. 14.

Figure 11:
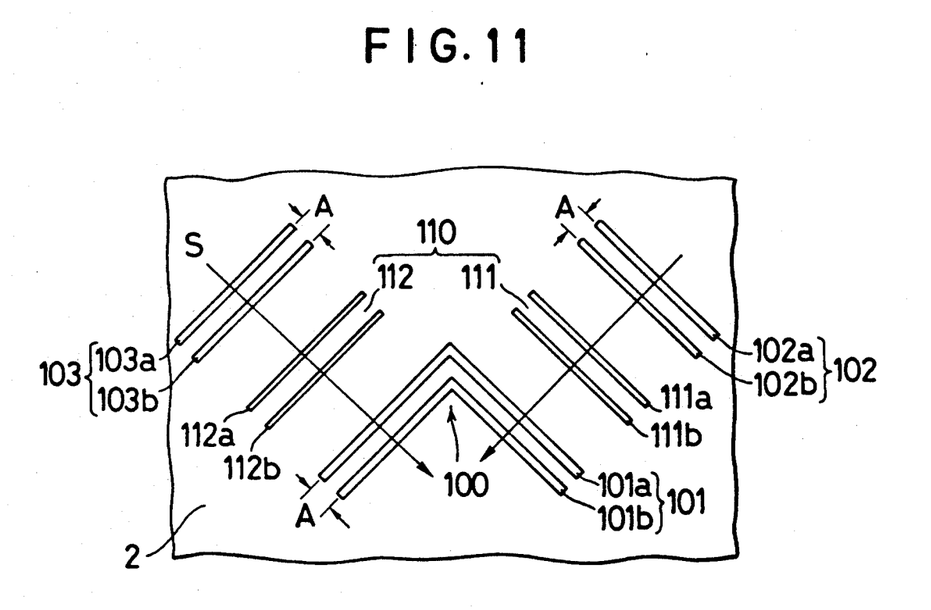
FIG. 11 illustrates a wafer alignment mark according to a first aspect of the invention.

With reference to FIG. 11, a wafer alignment mark 100 formed on the surface of a semiconductor wafer 2 comprises three patterns: a chevron 101, a first stripe 102, and a second stripe 103. The chevron 101 comprises a pair of parallel grooves 101a and 101b mutually separated by a certain distance A, each groove having two straight sections joined at a right angle. The first and second stripes 102 and 103 similarly comprise respective pairs of parallel grooves 102a and 102b, and 103a and 103b, the two grooves in each pair being separated by the same distance A. The first stripe 102 is parallel to the chevron 101 on one side of the right angle; the second stripe 103 is parallel to the chevron 101 on the other side of the right angle.

The grooves 101a, 101b, 102a, 102b, 103a, and 103b are preferably between two and three micrometers wide. The distance A is preferably between ten and twenty-five micrometers. The first and second stripes 102 and 103 are preferably disposed at a distance of seventy-five to one-hundred fifty micrometers from the chevron 101.

Shown superimposed on the wafer alignment mark 100 in FIG. 11 is a mask alignment mark 110 comprising two pairs of parallel slits: the pair 111 of slits 111a and 111b, and the pair 112 of slits 112a and 112b. The slits 111a, 111b, 112a, and 112b, which are two to three micrometers wide, are formed in a mask which is to be aligned with the wafer 2. The separation between the parallel slits 111a and 111b is the distance A described above; the separation between the parallel slits 112a and 112b is likewise the distance A.

Figure 12:
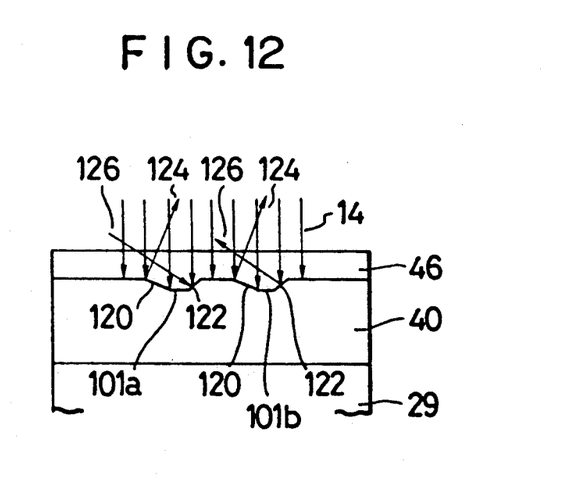
FIG. 12 is a sectional view of the wafer alignment mark in FIG. 11.

FIG. 12 shows a sectional view through the wafer alignment mark 100 at, for example, a point where one of the arrows in FIG. 11 crosses the chevron 101. The grooves 101a and 101b are formed by the same process as in the prior art; FIG. 12 corresponds to step (f) in FIG. 7. The wafer at this step thus comprises a silicon substrate 29 covered by an epitaxial layer 40 which has been spin-coated with a photoresist 46, the grooves 101a and 101b being formed in the surface of epitaxial layer 40. As in the prior art, each groove has a gently sloping edge 120 and a sharply sloping edge 122. Incident light 14 is scattered at one angle 124 from the gently sloping edges 120, and another angle 126 from the sharply sloping edges 122. When scattered light is detected by a photodiode array in an automatic alignment system, each groove produces a high peak and a low peak similar to the peaks in FIG. 9, although closer together.

Automatic alignment is carried out in the same way as in the prior art. Scanning along the arrow S in FIG. 11, for example, the automatic alignment system detects the peaks shown in FIG. 13A. High peaks 128a and 128b with a separation $T_1$ equivalent to the distance A are detected, representing the two grooves 103a and 103b of the second stripe 103, followed by high peaks 130a and 130b representing the slits 112a and 112b of the mask alignment mark, then high peaks 132a and 132b representing the grooves 101a and 101b of the chevron 101. The peaks 128a, 128b, 132a, and 132b are due to light reflected at the angle 126 in FIG. 12. The detection threshold is set so that lower peaks 134 due to light reflected at the angle 124 in FIG. 12 are not detected.

Figure 13A:
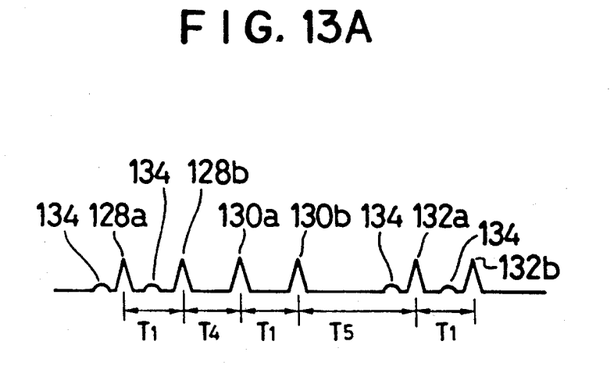
FIGS. 13A and 13B illustrate the alignment process using the wafer alignment mark in FIG. 11.
Figure 13B:
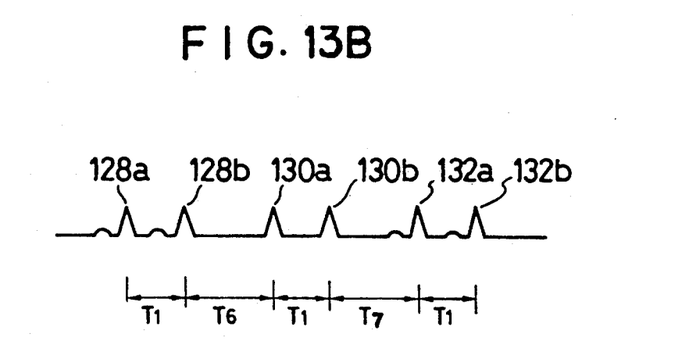
Figure 14A:
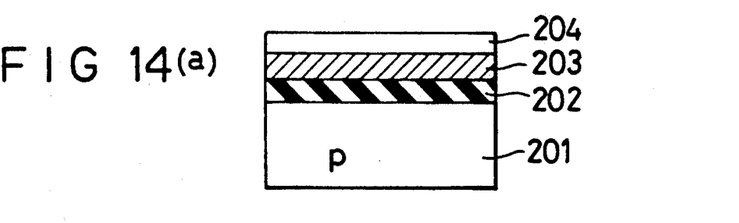
FIG. 14 illustrates steps in a process for fabricating an alignment mark according to a second aspect of the invention.
Figure 14B:
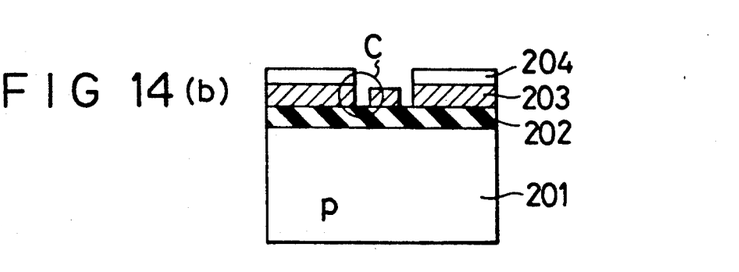
Figure 14C:
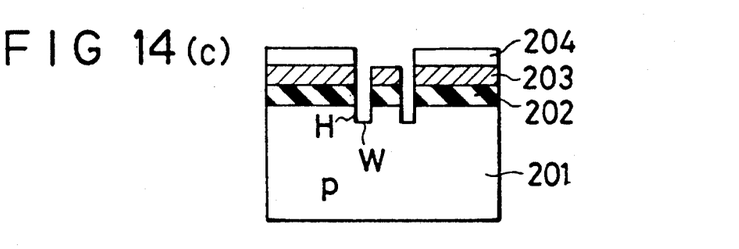
Figure 14D:
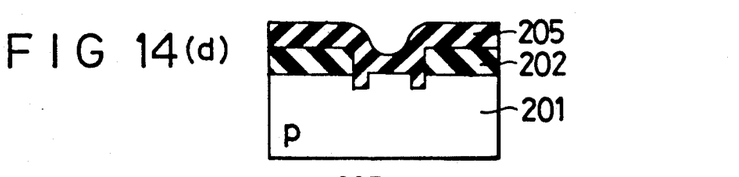
Figure 14E:
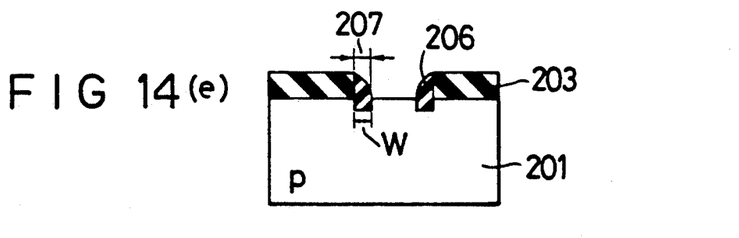
Figure 14F:
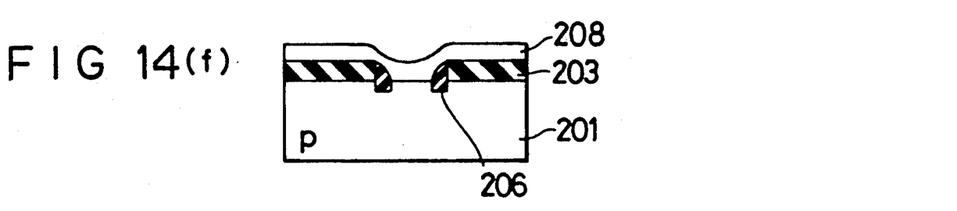
Figure 14G:
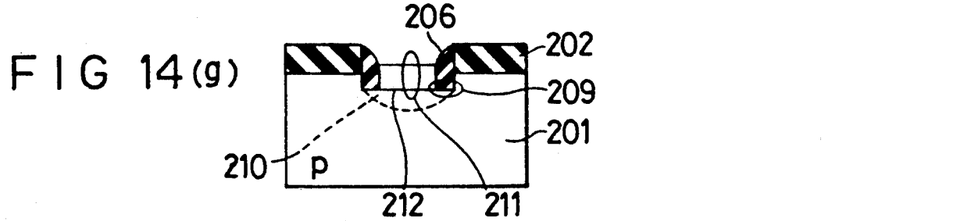
Figure 14H:
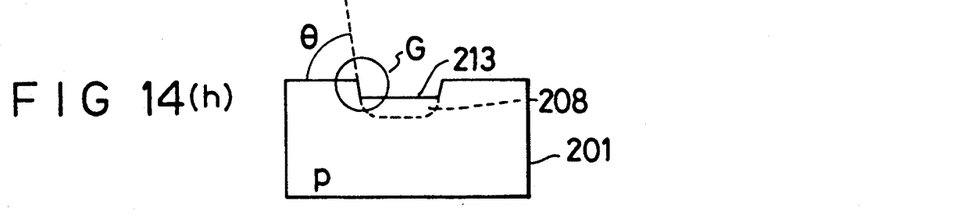
Figure 14I:
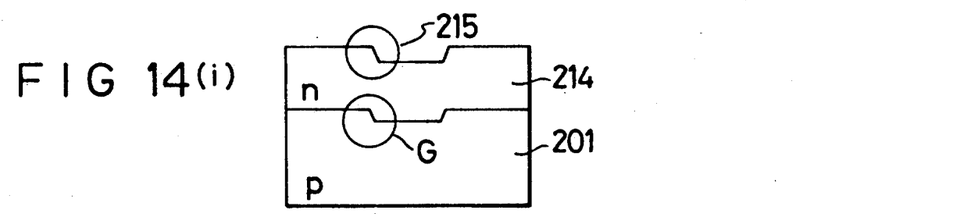
Figure 14J:
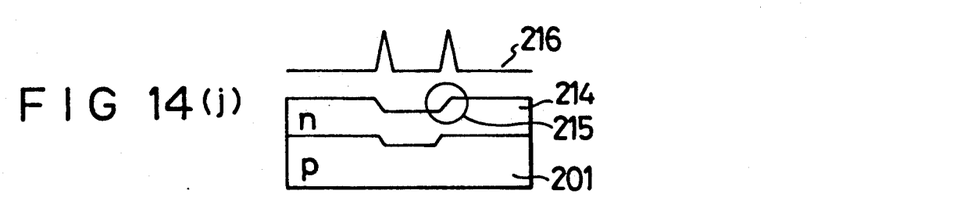

If the distance $T_4$ between the peaks 128b and 130a does not equal the distance $T_5$ between the peaks 130b and 132a, as in FIG. 13A, the wafer or mask is moved until equal distances are obtained as at $T_6$ and $T_7$ in FIG. 13B. The alignment process is carried out exactly as in the prior art, the only difference being in the structure of the wafer alignment mark.

An advantage of the novel alignment mark is that the peaks which the automatic alignment system must detect, such as the peaks 128a, 128b, 132a, and 132b in FIGS. 13A and 13B, are all strong enough to be detected reliably. Automatic alignment therefore succeeds and human intervention is not required.

Another advantage is that, since low peaks need not be detected, the detection threshold can be set high enough to eliminate most noise, thereby making the automatic alignment process more reliable than in the prior art.

Next a wafer fabrication process will be described that also forms reliably detectable wafer alignment marks. This process is applicable to the formation of wafer alignment marks comprising arbitrary patterns; it is not necessary for the patterns to consist of pairs of parallel grooves as in FIG. 11.

With reference to FIG. 14, the process begins from a wafer comprising a p-type semiconductor substrate 201. In step (a) in FIG. 14, an oxide layer 202 substantially one micrometer thick is formed by, for example, thermal oxidation or chemical vapor deposition (CVD), then a layer of molybdenum silicide ($MoSi_2$) substantially 3000 angstroms thick is formed by DC magnetron sputtering, after which a photoresist layer 204 is formed by spin coating.

In step (b) in FIG. 14, the photoresist 204 is selectively removed by standard photolithographic etching techniques to create windows for dopant diffusion and wafer alignment mark formation. The windows for wafer alignment mark formation have, for example, the chevron-and-stripes configuration shown in FIG. 2. A peripheral etching process is then performed as described, for example, in the paper "Ultra Sharp Trench Capacitors Formed by Peripheral Etching" submitted by Fujitsu Laboratories Ltd. and listed in Extended Abstracts of the 16th (1984 International) Conference on Solid State Devices and Materials. Peripheral etching proceeds from the photoresist 204, thus removing the $MoSi_2$ layer in a groove (circled and marked with the letter C in the drawing) around the periphery of the windows in the photoresist.

In step (c) in FIG. 14, a standard reactive ion etching (RIE) process is carried out which etches straight downward in areas not protected by the photoresist 204, thereby extending the grooves down into the substate 201. The grooves thus formed in the substrate preferably have a height H of 3000 angstroms and a width W of one micrometer.

In step (d) in FIG. 14, the remaining photoresist and $MoSi_2$ are removed, and a silicon nitride ($Si_3N_4$) layer 205 is formed by CVD. The $Si_3N_4$ layer 205 is substantially one micrometer thick, but thicker over the grooves in the substrate 201.

In step (e) in FIG. 14, RIE or another anisotropic etching process is carried out, using $CF_4$ gas for example, and a one-micrometer thickness of $Si_3N_4$ (the same thickness as deposited) is removed. Thus all Si$_3$N$_4$ is removed except for tapers 206 left in the grooves. The width W of the tapers is the same as the original width of the grooves when they were created by peripheral etching, preferably one micrometer.

In step (f) in FIG. 14, an antimony-silica film 208 such as the film used in the prior art is spin-coated as a dopant source.

In step (g) the wafer is heated to 1200° C. for substantially 500 minutes in a dry oxidizing atmosphere, causing dopants to diffuse through the windows into the substrate 201 and form diffusion layers 210. This process creates a drive-in oxide layer 211 substantially 3000 angstroms thick in the windows. The bottom of the drive-in oxide layer 211 extending to the bottom of the tapers 206 so that the entire window area has a flat interface 212 with the substrate 201.

In step (h) the oxide layer 202 and the drive-in oxide layer 211 are removed with hydrofluoric acid (HF), and phosphoric acid (at a temperature of 170° C.) is used to remove the tapers 206, leaving a depressed pattern 213 over the buried diffusion layer 210. Due to the peripheral etching of grooves in steps (b) and (c), the sidewalls (one of which is circled at G) are nearly vertical. The angle $\theta$ in FIG. 14 is close to 90°.

In step (i) an n-type epitaxial semiconductor layer 214 substantially 10 micrometers thick is grown on the substrate 201. The epitaxial growth process can be carried out using SiCl$_4$ gas at 1100° C. for 50 minutes, for example. The pattern of sidewalls on the surface of the substrate 201 is transferred to the epitaxial semiconductor layer 214, creating a pattern on the surface of the epitaxial semiconductor layer 214 with edges 215. Due to the nearly vertical slope of the sidewalls at G in the substrate 201, despite some occurrence of slumping, both edges 215 are quite sharp, having angles of substantially 70° to 80°.

In step (j) the wafer is aligned with a mask for further processing, using the same automatic alignment system as in the prior art. All edges of the wafer alignment marks are sharp enough to give strong signals 216, enabling automatic alignment to succeed.

The novel fabrication process is similar to the prior-art fabrication process except for the added peripheral etching steps and the formation of Si$_3$N$_4$ tapers, and the same wafer alignment mark patterns can be used as in the prior art. The novel fabrication process can accordingly be adopted to improve the reliability of automatic alignment without the need to make new masks.

The scope of this invention is not restricted to the embodiments shown in the drawings, but includes many modifications and variations that will be apparent to one skilled in the art. In particular, it is not necessary for the wafer alignment mark to have the configuration shown in FIGS. 2 and 11. The first aspect of the invention is applicable to any wafer alignment mark comprising a plurality of patterns, which need not be chevron or stripe patterns but may have other shapes. All that is necessary is for each pattern to comprise a pair of parallel grooves, and for the distance between the two grooves in each pair to be the same. The fabrication process described in the second aspect of the invention is also applicable to wafer alignment marks of arbitrary shape.

What is claimed is:

1. A wafer fabrication process comprising steps of:
   sequentially forming, on a first-conductive-type semiconductor substrate of a wafer, an oxide layer, an MoSi$_2$ layer, and a photoresist layer;
   opening windows in said photoresist layer for dopant diffusion and alignment mark formation, and removing the MoSi$_2$ layer from peripheral areas of said windows by peripheral etching;
   etching said oxide layer and said substrate to form grooves in areas from which said MoSi$_2$ layer has been removed;
   removing said photoresist and said MoSi$_2$ layer, forming an Si$_3$N$_4$ layer on said wafer, then removing said Si$_3$N$_4$ layer by anisotropic etching, leaving tapers of Si$_3$N$_4$ in said grooves;
   diffusing a dopant through said windows and forming a drive-in oxide layer in areas not occupied by said tapers;
   removing said oxide layer, said drive-in oxide layer, and said tapers, and forming a second-conductive-type epitaxial semiconductor layer on said substrate; and
   aligning said wafer with a mask according to light scattered from said epitaxial semiconductor layer.

2. The process of claim 1, wherein said grooves are etched to a width of substantially one micrometer and a depth of substantially 3000 angstroms in said first-conductive-type semiconductor substrate.

3. The process of claim 2, wherein said Si$_3$N$_4$ layer is formed with a thickness of substantially one micrometer, except in said grooves where the thickness is greater.

4. The process of claim 1, wherein said grooves and said drive-in oxide layer extend to equal depths in said substrate.

* * * * *